United States Patent
Kondo et al.

(10) Patent No.: US 7,398,190 B2
(45) Date of Patent: Jul. 8, 2008

(54) METHOD AND PROGRAM FOR LINKING DYNAMICS SIMULATION AND KINEMATIC SIMULATION

(75) Inventors: Koichi Kondo, Kawasaki (JP); Mitsunobo Yoshida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 301 days.

(21) Appl. No.: 10/743,090

(22) Filed: Dec. 23, 2003

(65) Prior Publication Data

US 2004/0186698 A1  Sep. 23, 2004

(30) Foreign Application Priority Data

Dec. 26, 2002  (JP)  ............................. 2002-376209
Nov. 19, 2003  (JP)  ............................. 2003-389710

(51) Int. Cl.
*G06F 17/10*  (2006.01)
(52) U.S. Cl. ........................ 703/2; 703/1; 703/6; 703/7
(58) Field of Classification Search ............... 703/1–28; 700/25, 28, 6, 17, 19, 30; 345/653, 659, 345/473; 368/229
See application file for complete search history.

(56) References Cited

U.S. PATENT DOCUMENTS

| | | | |
|---|---|---|---|
| 5,043,929 A * | 8/1991 | Kramer et al. .................. 703/1 |
| 5,294,873 A * | 3/1994 | Seraji ....................... 318/568.1 |
| 5,341,289 A * | 8/1994 | Lee ............................. 700/253 |
| 5,452,238 A * | 9/1995 | Kramer et al. .................. 703/1 |
| 5,754,023 A * | 5/1998 | Roston et al. ................ 318/561 |
| 5,812,394 A * | 9/1998 | Lewis et al. .................... 700/17 |
| 5,831,853 A * | 11/1998 | Bobrow et al. ................. 700/86 |
| 6,046,727 A * | 4/2000 | Rosenberg et al. ........... 345/156 |

(Continued)

FOREIGN PATENT DOCUMENTS

JP  2001-222572  8/2001

OTHER PUBLICATIONS

P. Aarnio, K. Koskinen, and S. Ylonen, "Using simulation during Development of Combined Manipulator and Hybrid Locomotion Platform", Jun. 18, 2001, pp. 1-8, Helsinki University of Technology, Espoo, Finland, an extra one page to show the date the PDF created.*

(Continued)

*Primary Examiner*—Kamini S Shah
*Assistant Examiner*—Kibrom K Gebresilassie
(74) *Attorney, Agent, or Firm*—Oblon, Spivak, McClelland, Maier & Neustadt, P.C.

(57) ABSTRACT

A mechanism simulation method of using both a dynamics simulation and a kinematic simulation is described. In the dynamics simulation, a behavior of a mechanism is simulated using a dynamics model including a continuous system equation having a plurality of variables. In the kinematic simulation, a geometrical operation of the mechanism is simulated using a three-dimensional mechanism model including a plurality of mechanism elements. A value of one of the variables of the continuous system equation is calculated by a first simulator that executes the dynamics simulation. Referring to a table that represents a correspondence between the variables and the mechanism elements, a mechanism element corresponding to a variable having the calculated value is identified. Information specifying the identified mechanism element and the calculated value of the variable is transmit to a second simulator, which executes the kinematic simulation based on the information.

6 Claims, 10 Drawing Sheets

U.S. PATENT DOCUMENTS

| | | | | |
|---|---|---|---|---|
| 6,111,577 | A * | 8/2000 | Zilles et al. | 715/701 |
| 6,191,798 | B1 * | 2/2001 | Handelman et al. | 345/473 |
| 6,278,962 | B1 * | 8/2001 | Klimasauskas et al. | 703/13 |
| 6,289,502 | B1 * | 9/2001 | Garland et al. | 717/104 |
| 6,321,157 | B1 * | 11/2001 | Sun et al. | 701/103 |
| 6,445,964 | B1 * | 9/2002 | White et al. | 700/61 |
| 6,505,085 | B1 * | 1/2003 | Tuttle et al. | 700/28 |
| 6,526,373 | B1 * | 2/2003 | Barral | 703/6 |
| 6,680,812 | B1 * | 1/2004 | Iwashiro | 360/78.06 |
| 6,816,821 | B1 * | 11/2004 | Barrett | 703/2 |
| 6,873,947 | B1 * | 3/2005 | Huang et al. | 703/10 |
| 6,876,903 | B2 * | 4/2005 | Takenaka | 700/245 |
| 6,983,227 | B1 * | 1/2006 | Thalhammer-Reyero | 703/2 |
| 7,027,965 | B2 * | 4/2006 | Hannaford et al. | 703/2 |
| 7,054,694 | B2 * | 5/2006 | Fujinami et al. | 700/29 |
| 7,058,551 | B2 * | 6/2006 | Nakamura et al. | 703/1 |
| 7,079,984 | B2 * | 7/2006 | Eryurek et al. | 702/185 |
| 7,084,884 | B1 * | 8/2006 | Nelson et al. | 345/619 |
| 7,125,388 | B1 * | 10/2006 | Reinkensmeyer et al. | 601/5 |
| 7,130,781 | B2 * | 10/2006 | Bay et al. | 703/7 |
| 7,159,211 | B2 * | 1/2007 | Jalan et al. | 717/149 |
| 7,251,536 | B2 * | 7/2007 | Hashimoto et al. | 700/29 |
| 2002/0032697 | A1 * | 3/2002 | French et al. | 707/500.1 |
| 2003/0079207 | A1 * | 4/2003 | Xavier et al. | 717/135 |
| 2003/0195726 | A1 * | 10/2003 | Kondo | 703/2 |
| 2004/0044440 | A1 * | 3/2004 | Takenaka | 700/245 |
| 2004/0158442 | A1 * | 8/2004 | Kondo | 703/1 |
| 2004/0181380 | A1 * | 9/2004 | Yoshida et al. | 703/7 |
| 2005/0001759 | A1 * | 1/2005 | Khosla | 342/90 |
| 2005/0113973 | A1 * | 5/2005 | Endo et al. | 700/245 |
| 2006/0285936 | A1 * | 12/2006 | Muller et al. | 409/51 |
| 2007/0299642 | A1 * | 12/2007 | Kondo | 703/6 |

OTHER PUBLICATIONS

V. Gupta, R. Jagadeesan and V. A. Saraswat, "Computing with continuous change" Dept. of Mathematical and Computer Science, Loyola University-Lake Shore Campus, Chicago, IL 60626, May 7, 1999, pp. 1-53.*

B. Silva, K. Richeson, B. Krogh, A. Chutinan, "Modeling and Verifying Hybrid Dynamic Systems Using Checkmate," PDF File Created on Jan. 12, 2001.*

P. Aarnio, K. Koskinen, S. Ylonen, "Using Simulation During Development of Combined Manipulator and Hybrid Locomotion Platform," PDF File Created on Jun. 18, 2001.*

B. Silva, K. Richeson, B. Krogh, A. Chutinan, Modeling and Verifying Hybrid Dynamic Systems Using Checkmate, pp. 1-7, PDF File Created on Jan. 12, 2001.*

P. Aarnio, K. Koskinen, S. Ylonen, Using Simulation During Development of Combined Manipulator and Hybrid Locomotion Platform, pp. 1-8, PDF File Created on Jun. 18, 2001.*

E. Aaron, h. Sun, A hybrid Dynamical Systems Approach to Intelligent Low-Level Navigation, pp. 1-11, IEEE 2002.*

P. J. Mosterman, An Overview of Hybrid Simulation Phenomena and Their Support by Simulation Packages, pp. 1-10, 1999.*

P. J. Mosterman; F. W. Vaandrager and J. H. van Schuppen (Eds.), Hybrid Systems 99, LNCS 1569, pp. 165-176, "An Overview of Hybrid Simulation Phenomena and Their Support by Simulation Packages", 1999.

B. Carlson, et al., pp. 1-29, "The hcc Programer's Manual".

V. Gupta, et al., Science of Programming, vol. 30, No. 1-2, pp. 1-55, "Computing With Continuous Change", 1998.

B. Carlson, et al., T. A. Henzinger and S. Sastry (Eds.), Hybrid Systems 98, 16 pages, "Hybrid cc With Interval Constraints", 1998.

* cited by examiner

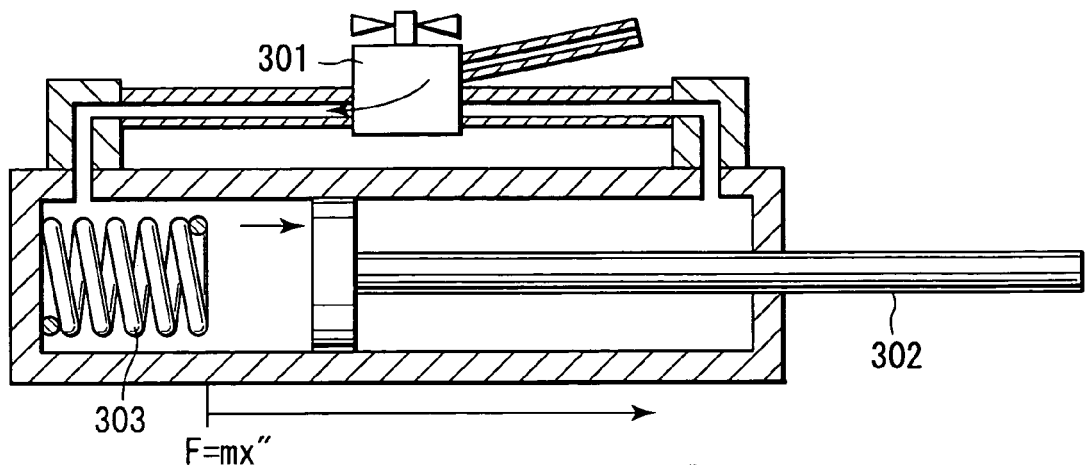
FIG. 5
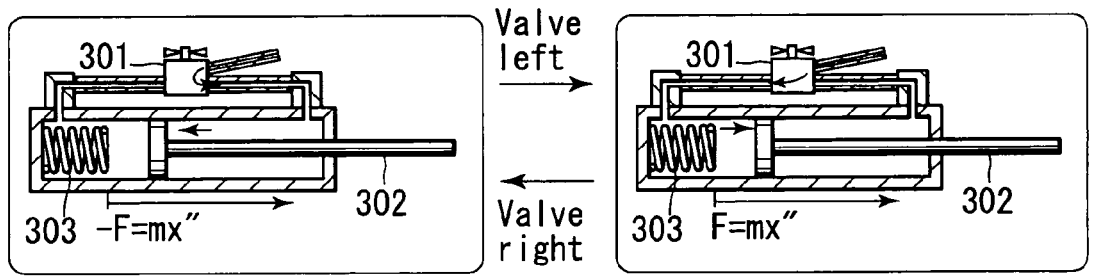
FIG. 6
```
⎧ L1···#define m 1
⎪ L2···#define f 100
⎪ L3···[Right]─ev1        ─ev2
⎨ L4···wait 50 do [Left] ─ev3
⎪ L5···always if [Left] then do always [F=m*x"] watching Right,
⎪ L6···always if [Right] then do always [-F=m*x"] watching Left,
⎪ L7···sample(x),         ─ev4
⎩ L8···x=0, x'=0,
```
eq1 points to F=m*x"
eq2 points to -F=m*x"
FIG. 7

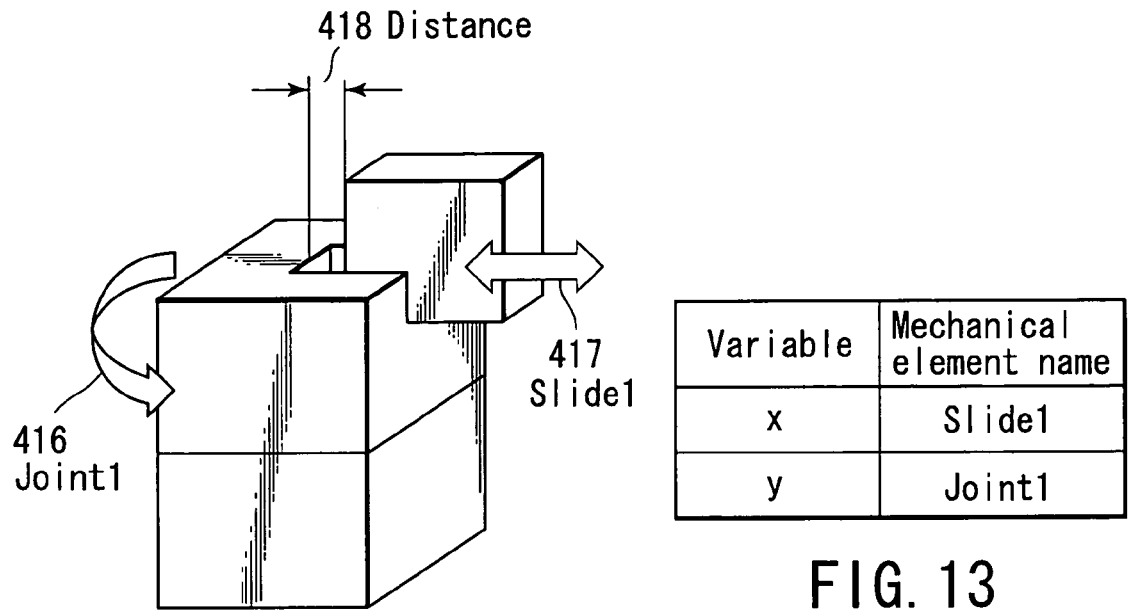
FIG. 12
FIG. 13
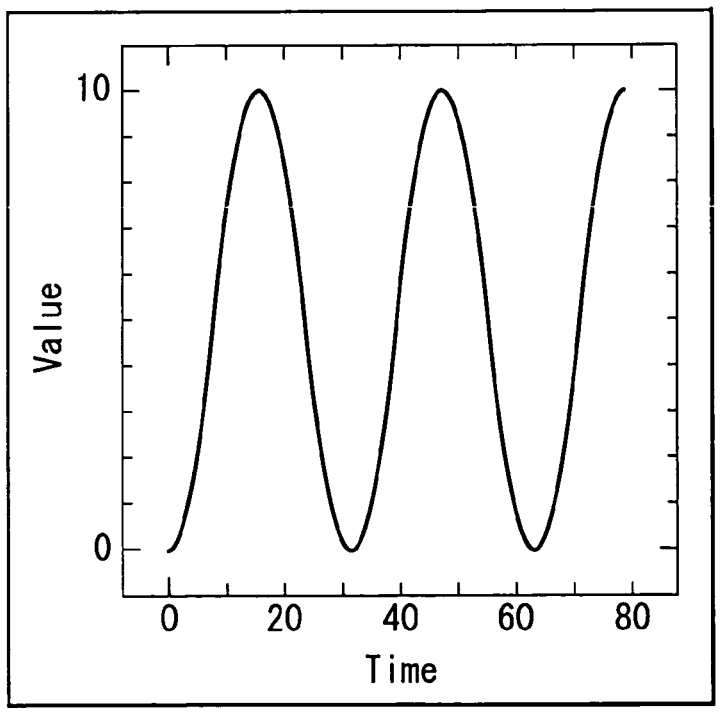
FIG. 14

```
class DCML_Class
{
    public cont m_a;
    DCML_Class(cont a) {
        m_a = a;
        m_a' = 0.01;
    }
    def {
        do {
            always m_a"+(1/4)*m_a'+0.03*m_a = 1/2;
        } watching(m_a' = 0);

when(m_a' = 0) always {m_a' = 0; }
    }
};
DCML_Class app1(1);
sample(app1.m_a);
```

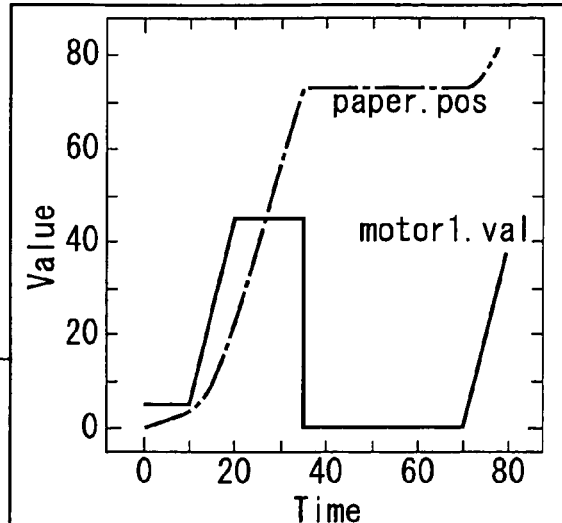

```
                                    S1
cont time;
time = 0;
always {time' = 1;} class Motor
{
  Motor(cont init_val, cont acc_end, cont end) {
    val_     =init_val;
    acc_end_ =acc_end;
    end_     =end;
  }
  public event go_;
  private cont end_, acc_end_;
  public cont val_, start_time_;
  def {
    always {end_' = 0;acc_end_' = 0;start_time_' = 0;}
    do {always val_' = 0; } watching(go_);
    when(go_)start_time_ = time;
    when(go_)always {
        do {always val_' = 4;} watching (time=start_time_+acc_end_);
        when (time=start_time_+acc_end_)
            do {always val_' = 0;} watching (time=start_time_+end_)
          when (time = start_time_+end_)always val_ = 0;
    }
  }
};
                                        ┌──────────────────────────────────┐
class Paper                             │ always paper.val_ = motor1.val_; │
{                                       │ when (time = 10)motor1.go_;      │
    public cont val_, pos_;             │ when (time = 70)motor1.go_;      │
    def {                               │                                  │
        pos_     =0;                    │ Paper paper;                     │
        always pos_' = val * 0.075;     │ Motor motor1 (5.0,10.,25.);      │
    }                                   │                                  │
};                                      │ sample (motor1.val_);            │
                                        │ sample (paper.pos_);             │
                                        └──────────────────────────────────┘
                                                                          S2
```

FIG. 16

METHOD AND PROGRAM FOR LINKING DYNAMICS SIMULATION AND KINEMATIC SIMULATION

CROSS-REFERENCE TO RELATED APPLICATIONS

This application is based upon and claims the benefit of priority from the prior Japanese Patent Applications No. 2002-376209, filed Dec. 26, 2002; and No. 2003-389710, filed Nov. 19, 2003, the entire contents of both of which are incorporated herein by reference.

BACKGROUND OF THE INVENTION

1. Field of the Invention

The present invention relates to a method and program for simulating the behavior of a mechanism using a computer, and in particular, to the use of both a dynamics simulation relating to the behavior of a mechanism along a time axis and using a continuous system equation including differential or algebraic equations and a kinematics simulation using a three-dimensional mechanism model containing three-dimensional shape data.

2. Description of the Related Art

Presently, when a computer is used to simulate the behavior of a continuous system such as a machine or a plant on a time axis, an object is modeled using differential equations. Then, a solution is obtained using a technique such as a numerical integration. Moreover, a technique called "hybrid modeling" may be used to express the behavior of a complicated system. A simulation using a hybrid model, which is an advanced version of a normal simulation based on simultaneous differential equations, is called a "hybrid simulation". A system executing such a simulation behavior is sometimes called a "hybrid system". A hybrid model intended for simulation is conceptually a combination of a continuous model expressed by simultaneous equations including ordinary differential or algebraic equations with a state transition model for expressing state transitions associated with the occurrences of events. The hybrid model enables the expression of a system in which a state expressed by a continuous system model is instantaneously switched by an external event. The hybrid model thus enables a more advanced model expression.

A language called HCC (Hybrid Concurrent Constraint Programming), created by Palo Alto Laboratory of Xerox (trade mark), U.S., is used to describe a hybrid model. The HCC is still being developed and studied in the Ames Research Center of NASA, U.S. The HCC is a kind of technique called "constraint programming". The HCC enables ordinary differential or algebraic equations to be treated as constraints and directly described in no particular order. A hybrid model in the HCC language is completed by adding descriptions for controlling state transitions to such constraint descriptions. The HCC enables equations to be enumerated (programmed) directly as constraints to describe a complicated model.

Thus, the use of the hybrid model technique enables the characteristics of a system to be modeled using ordinary differential equations. This in turn enables a simulation as to how the behavior of the system varies over time starting with its initial state. Modeling based on differential equations enables the expression of dynamic behavior such as transitional responses or vibrations caused by disturbances. Accordingly, this modeling is also called a "dynamics simulation".

The hybrid model technique enables the adequate modeling of an object or a phenomenon that can be expressed using differential equations. An example of application of this technique is a mechanism simulation for mechatronics equipment the mechanism of which is controlled by software. Such a mechanism simulation allows the prototyping, testing, or debugging of control software system that controls the mechanism even if there is no actual equipment for the mechanism.

On the other hand, a technique is known which uses three-dimensional shape data on the mechanism, information on connections between parts via joints to simulate geometric operations of the mechanism in a three-dimensional space. This technique corresponds to a three-dimensional CAD technique or mechanism simulation software. Reference can be made to, for example, the technique described in Jpn. Pat. Appln. KOKAI Publication No. 2001-222572. Such software cannot simulate the behavior of a system such as a vibration characteristic which operates along a time axis. However, it can handle complicated positional relationship and is sometimes called a "kinematics simulation".

The technique described in Jpn. Pat. Appln. KOKAI Publication 2001-222572 is a well-known example in which a mechanism simulation of mechatronics equipment the mechanism of which is controlled using software is implemented within the range of a kinematics simulation and limited dynamics limitedly and already incorporated into package software.

Some pieces of mechanism simulation software incorporate the functions of a dynamics simulation to allow both kinematics and dynamics to be handled. However, such software does not correspond to a dynamics simulation that can flexibly model a complicated system in connection with the programming language shown above as the HCC. Thus, it has been impossible for a user to select an optimum modeling technique in accordance with the purpose of a simulation, create a model description on the basis of this technique, and use this model description to execute a kinematics simulation and a dynamics simulation in parallel. Moreover, if a more complicated hybrid modeling technique is used, it is difficult to allow a kinematics simulation and a dynamics simulation to cooperate with each other.

BRIEF SUMMARY OF THE INVENTION

Accordingly, the present invention is directed to a method and computer program that allows a dynamics simulation to cooperate easily and effectively with a three-dimensional kinematics simulation.

In accordance with the purpose of the invention, as embodied and broadly described, the invention is directed to a method and computer program for performing a mechanism simulation using both a dynamics simulation and a kinematic simulation. In the dynamics simulation, a behavior of a mechanism is simulated using a dynamics model including a continuous system equation having a plurality of variables. In the kinematic simulation, a geometrical operation of the mechanism is simulated using a three-dimensional mechanism model including a plurality of mechanism elements. A value of one of the variables of the continuous system equation is calculated by a first simulator that executes the dynamics simulation. Referring to a table that represents a correspondence between the variables and the mechanism elements, a mechanism element corresponding to a variable having the calculated value is identified. Information specifying the identified mechanism element and the calculated value of the variable is transmit to a second simulator, which executes the kinematic simulation based on the information.

BRIEF DESCRIPTION OF THE SEVERAL VIEWS OF THE DRAWING

FIG. 5 is a diagram showing another state of the cylinder apparatus according to the specific example useful in describing the hybrid model description, according to the first embodiment of the present invention;

FIG. 6 is a diagram showing a state transition of the cylinder apparatus according to the specific example useful in describing the hybrid model description, according to the first embodiment of the present invention;

FIG. 7 is a diagram showing the contents of a hybrid model description according to the first embodiment of the present invention;

FIG. 12 is a diagram showing that the motion of a mechanism is expressed as a three-dimensional-graphics-based animated image;

FIG. 13 is a table illustrating correspondences between variables and mechanism elements according to the first embodiment of the present invention;

FIG. 14 is a diagram showing an example of a simple DCML program that does not contain any discontinuous changes according to a second embodiment of the present invention;

FIG. 16 is a diagram showing an example of a paper conveying system model according to the second embodiment of the present invention;

DETAILED DESCRIPTION OF THE INVENTION

Embodiments consistent with the present invention provide an advanced simulation employing both a dynamics simulation and a kinematics simulation executed in parallel to be applied to an actual-equipment-less simulation of mechatronics equipment the mechanism of which is controlled by software.

It is possible to allow such a dynamics simulation as uses a hybrid model to cooperate easily and effectively with a three-dimensional kinematics simulation. Furthermore, a dynamics simulation unit can make free descriptions using a programming language such as a hybrid model description language. This enables a complicated mechanism system to be easily and accurately modeled. Therefore, a simulation method and program can be provided which is suitable for a simulation executed in cooperation with control software that controls the mechanism system.

In the description below, a hybrid modeling technique is employed as a dynamics simulator. Description will be given in which the dynamics simulator cooperates with a mechanism control software system or its simulator.

Embodiments of the present invention will be described below with reference to the drawings.

First Embodiment

Figure 1:
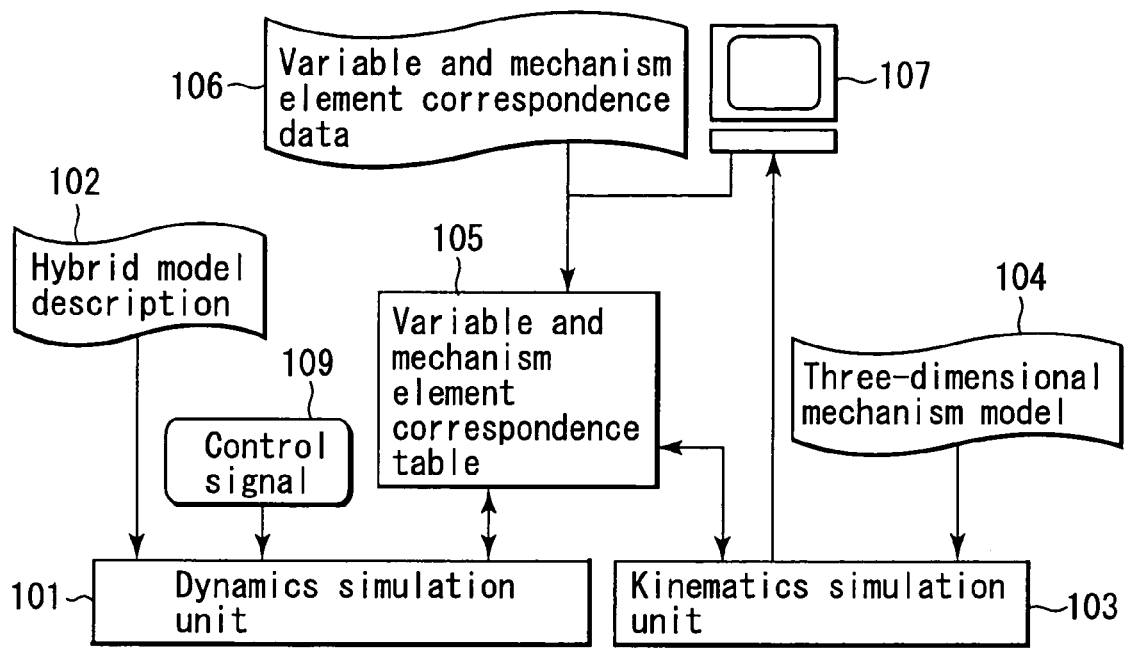
FIG. 1 is a block diagram schematically showing a mechanism simulator according to a first embodiment of the present invention.
Figure 2:
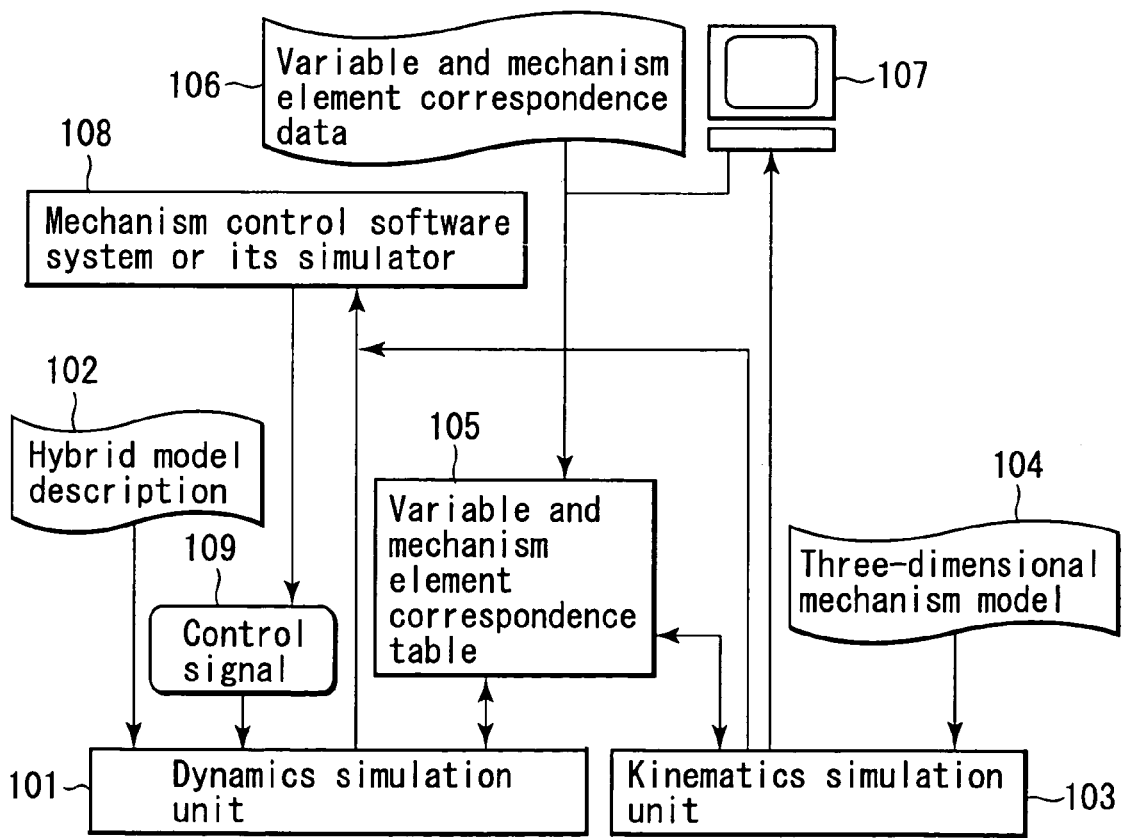
FIG. 2 is a block diagram showing that the mechanism simulator according to the first embodiment of the present invention cooperates with mechanism control software system.

FIG. 1 is a block diagram schematically showing a mechanism simulator according to a first embodiment of the present invention. FIG. 2 shows a configuration in which the mechanism simulator cooperates with mechanism control software system or its simulator.

The mechanism simulator includes a dynamics simulation unit 101, a kinematics simulation unit 103, and a variable and mechanism element correspondence table 105. The mechanism simulator transmits and receives a control signal to and from the mechanism control software system or its simulator 108. The present embodiment can be constructed using a common computer 107. The computer 107 basically comprises hardware including a central processing unit (CPU), memory, an external storage device, a communication interface (I/F), a display device, and an input device such as a keyboard or a mouse, none of which are shown in the drawings. The computer 107 also comprises an operating system (OS) for controlling the hardware. The mechanism simulator according to the embodiment of the present invention can be mounted as application software operating on such an operating system.

A dynamic model description of a mechanism to be simulated is achieved using a hybrid model description language described later in detail. This model description is already stored as a file (hybrid model description) 102. Mechanism model data including three-dimensional geometric information is also already saved as a file (three-dimensional mechanism model) 104 in accordance with a predetermined format. At this stage, the dynamics simulation unit 101 and the kinematics simulation unit 103 can operate independently. Then, data is set in a variable and mechanism element correspondence table 105 by loading correspondence data 106 between variables appearing in an already saved dynamics model description and the mechanism elements of a three-dimensional mechanism model or inputting data directly from an input device such as a PC keyboard. Then, the dynamics simulation unit 101 and the kinematics simulation unit 103 are ready for cooperative operations.

In an actual simulation, acceleration commands for an actuator such as a motor and information on parameter settings for an acceleration rate are transmitted by the mechanism control software system or its simulator 108. Then, the behavior of a system is computed using a numerical integration based on appropriate state transitions and equations described as a hybrid model on the basis of the above commands and information. A detailed description will be given later of how the hybrid model can express dynamics and realize the state transition.

In an actual mechanism control, commands and parameters from the mechanism control software system are obtained through a polling process of inquiring of a specified I/O port at intervals of a fixed time cycle. Accordingly, a simulation is executed using the same time intervals.

Figure 3:
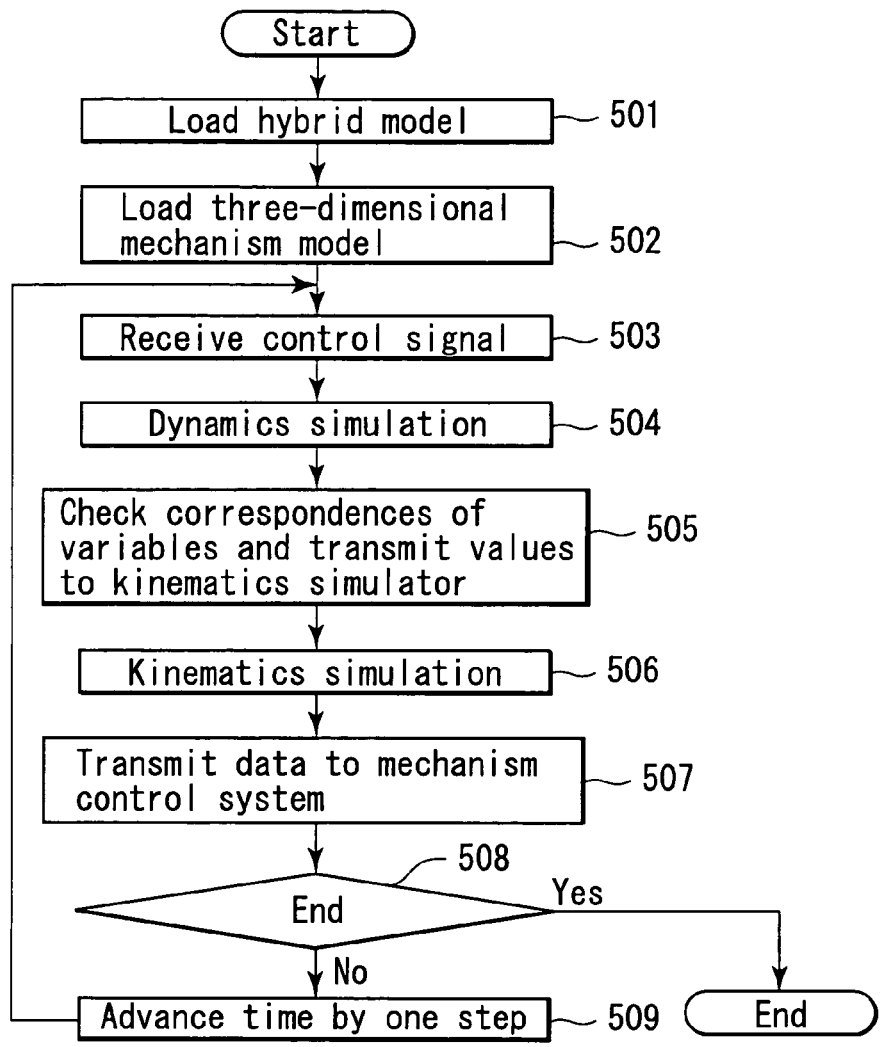
FIG. 3 is a flow chart showing the process procedure of a mechanism simulation according to the first embodiment of the present invention.

Specifically, as shown in the flow chart shown in FIG. 3, a simulation is started by executing a step 501 of loading a hybrid model is loaded and a step 502 of loading a three-dimensional mechanism model (no problems occur even if steps 501 and 502 are executed in the reverse order). A control signal receiving step 503 is executed to load a control signal at intervals of the fixed cycle. A dynamics simulation step 504 is executed to calculate the behavior of the system using a numerical integration based on appropriate state transitions and equations based on the control signals. Thus, the values of variables are calculated. Accordingly, a step 505 is executed to check the correspondences between the variables and the mechanism elements and transmit corresponding values to the kinematics simulation unit. On the basis of these values, a kinematics simulation is executed at a step 506. A mechanism control system receives sensor information from the mechanism to determine whether or not a new control command is required. Accordingly, a step 507 is executed to transmit mainly sensor data obtained from the dynamics simulator 101 or the kinematics simulator 103 to the mechanism control system. Subsequently, a step 508 is executed to determine whether or not the simulation has progressed for a specified time. If the simulation is still being executed, a step 509 is executed to carry out processing such as data recording in order to proceed to the next time. The procedure then returns to the control signal reception step 503.

With reference to a specific example, description will be given of the details of the hybrid model description 102 for the dynamics simulation according to the present embodiment.

Figure 4:
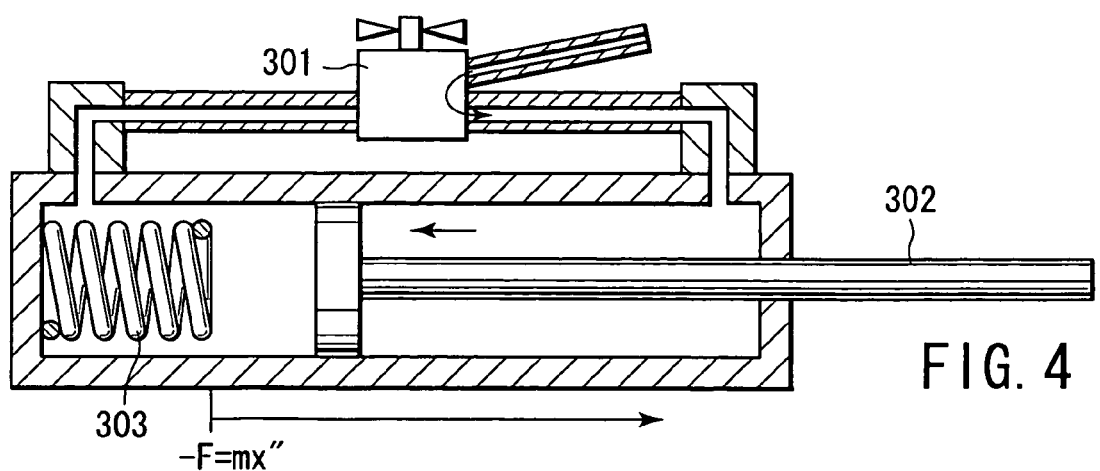
FIG. 4 is a diagram showing a certain state of a cylinder apparatus according to a specific example useful in describing a hybrid model description, according to the first embodiment of the present invention.

FIGS. 4 and 5 are diagrams showing a mechanism to be described using a hybrid model according to the specific example. This mechanism is a cylinder apparatus having a simple configuration comprising a valve 301, a spring 303, and a piston.

The valve 301 is opened and closed in response to an external instruction (event). Thus, an event that changes the flow of air in the cylinder apparatus to a rightward one as shown in FIG. 2 is called "Right". An event that changes the flow of air to a leftward one is called "Left". FIG. 4 shows that a Right event is provided to the valve 301. A force exerted in the left direction of the sheet of the drawing acts on the piston 302. An equation of motion indicative of this state is "$-F=mx''$" as shown under the cylinder apparatus. In contrast, FIG. 5 shows that a Left event is provided to the valve 301. The flow of air is changed, and the equation of motion is also changed to "$F=mx''$" as shown in this figure.

FIG. 6 is a state transition diagram representing such a state transition and equations of motion corresponding to the respective states. A hybrid model refers to an expression of a state transition such as the one shown in FIG. 6 and the corresponding states using differential or algebraic equations. FIG. 6 shows that there are two states and that a state transition is present between the two states.

FIG. 7 is a diagram showing an example of a program describing the contents of a specific hybrid model using the HCC (Hybrid Concurrent Constraint Programming) language on the basis of the state transition diagram shown in FIG. 6. In FIG. 7, logical line numbers in the (source) program are presumably labeled as L1 to L8. L3, L4, and L8 correspond to descriptions of the initial state of this mechanism and operation conditions such as a valve operation timing. L5 and L6 describe the state transition shown in FIG. 6.

Within the program, the HCC can describe an equation of motion as it is, as is apparent from the figure. Conditions for a transition to a certain state may be described after the phrase "always if". Conditions for a transition from a certain state may be described after the word "watching".

With the HCC, the program is not executed in accordance with the order of its descriptions (the order of the logical line numbers L1 to L8, shown in FIG. 7). With the HCC, those of the individual program descriptions which are established along a time axis on which the simulation is executed are searched for and executed. That is, the order of the logical line numbers L1 to L8 does not relate to the order of execution. For example, when the simulation is started, only L3 and L8 are effective. Then, L3 causes an event Right (ev1) to activate Right, a precondition for L6. This in turn activates an equation of motion eq2 described in L6. That is, the simulation is started in the state shown in the left of in FIG. 4.

Furthermore, when the time becomes 50, L4 is activated, an event Left (ev2) occurs to activate an L6 transition condition (the condition following the word "watching", i.e. Left), while disabling the equation of motion eq2 in L6. Instead, the precondition shown in L5 is activated to activate an equation of motion eq1.

The above program example is a description of state transitions caused by external events (ev3 and ev4). However, of course, the state may be changed on the basis of an internal situation. For example, if in FIG. 4, the valve 301 cannot be switched, the moving piston 302 comes into contact with the spring 303 and then undergoes a reaction force from the spring 303. Specifically, in connection with the position of the piston 302, a state transition may occur even without any external events. In such a case, it can be determined whether or not a state transition is required, on the basis of the results of an evaluation using an evaluation equation (inequality) for an internal variable indicating, for example, whether or not the variable x is positive.

In general, a hybrid model is a combination of a continuous system model expressed by ordinary differential or algebraic equations or simultaneous equations (continuous system equation) comprising ordinary differential or algebraic equations, with a state transition model for expressing state transitions associated with occurrences of events. The hybrid model enables the expression of a system in which a state expressed by a continuous system model is instantaneously switched by an external event.

Now, with reference to FIGS. 10 to 12, description will be given of a specific embodiment of the three-dimensional mechanism model 104 and the kinematics simulation unit 103.

Figure 10:
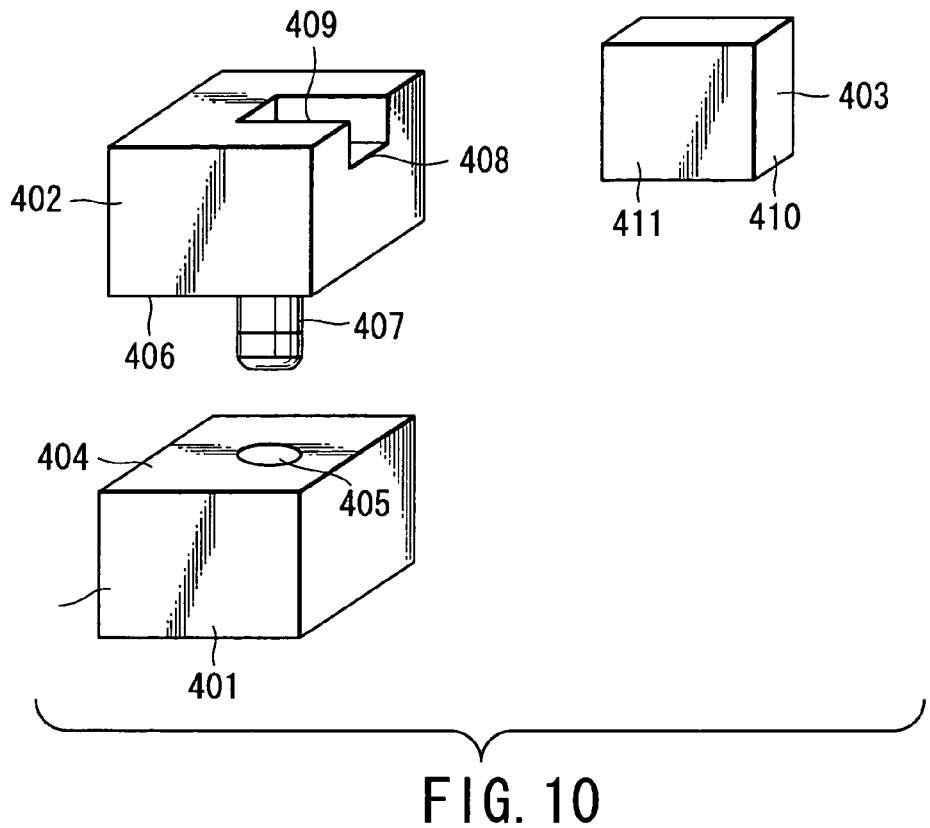
FIG. 10 is a diagram illustrating components of a three-dimensional mechanism model according to the first embodiment of the present invention.

As shown in FIG. 10, the three-dimensional mechanism model 104 expresses the shape of each part as a set of its components such as surfaces, contours, vertices, and other elements. These surfaces, contours, vertices, and others express the boundary of the shape of the part and are thus called a "geometric model for boundary expression". This model is widely used in three-dimensional CAD systems for example. The relationship between the individual parts is further expressed as the relationship between the geometric elements of the parts. In this example, the three-dimensional shapes of a part 401, a part 402, and a part 403 are provided. The relationship is defined in which a plane 404, a part shape of the part 401 coincides with a plane 406, a part shape of the part 402, and in which a cylindrical surface 405 and a cylindrical surface 407 are coaxial. Likewise, for the defined relationship between part shapes of the parts 402 and 403, a plane 408 coincides with a plane 410, and a plane 409 coincides with a plane 411.

Figure 11:
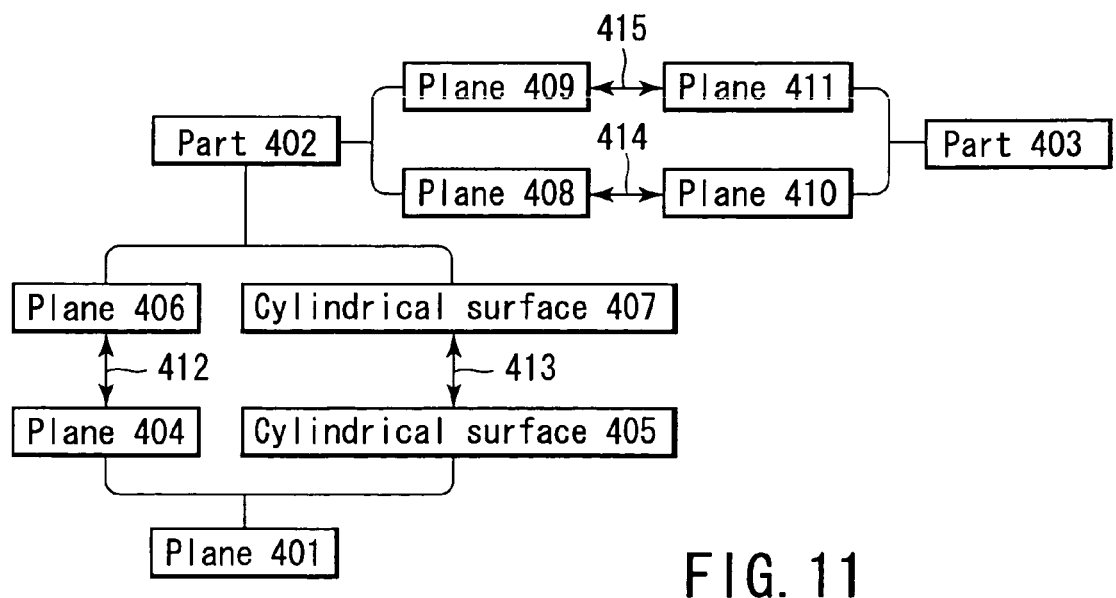
FIG. 11 is a diagram in graph form illustrating the format of relationships defined by the three-dimensional mechanism model, the format being used when the relationships are stored in storage means such as a computer memory.

FIG. 11 is a graph showing the format of the relationships defined in FIG. 10, the format being used when the relationships are stored in storage means such as a computer memory. In addition to information on three-dimensional shapes and on part shapes, coincidence relationships 412, 414, and 415 between the planes and a coaxial relationship 413 between the cylinders are present as data. To provide a function of calculating the relative relationships between the parts 401 and 402 and 403 from the above information, existing software is provided as a geometric constraint processing library. Specifically, for each part, a local coordinate system unique to the part is set, and the positional relationships are expressed as a transformation matrix between the local coordinate system and a world coordinate system fixed in a space. That is, on the basis of the relationships such as coincidences which are shown in FIG. 11, a transformation matrix for expressing the positions of the parts 401, 402, and 403 is automatically calculated using the geometric constraint processing library.

FIG. 12 shows an example of the positional relationship between the parts calculated so as to meet the coincidence relationships defined between the part shapes, i.e. the constraint relationships between the part shapes. That is, this figure shows the positions of the parts obtained by allowing the transformation matrix for the parts automatically calculated by the geometric constraint processing library to act on the shape data on the parts. The thus assembled parts have a degree of freedom of rotation shown at 416 and a degree of freedom of translation shown at 417. To allow these parts to actually operate as a mechanism, actuators such as motors are installed on the parts to drive them on an external signal. Thus, the actuator installed for the degree of freedom of rotation 416 is named Joint1. The actuator installed for the degree of freedom of translation 417 is named Slide1. When the names of and values for the actuators are specified, the kinematics simulation unit 103 enables the motion of the mechanism to be checked in a three-dimensional-graphics-based animated image such as the one shown in FIG. 12. Furthermore, the kinematics simulation unit 103 is provided with a function of calculating a distance 418, shown in FIG. 12. The value of this distance is determined to enable the simulation of the functions of a limit switch sensor that carries out detection as to whether the part 403 has reached the end of a groove. This sensor is presumably named Switch 1. Then, upon inquiring about the state of the sensor using the name Switch1, the kinematics simulation unit 103 can obtain the current state of the sensor.

Now, it is assumed that the actuator Slide1 is actually attached to the cylinder apparatus shown in FIG. 4. In this case, the variable x in the description of the dynamics simulator in FIG. 7 corresponds to the actuator Slide1, a mechanism element. It is also assumed that the behavior of the motor corresponding to Joint1 is expressed by the variable y in the description of the dynamics simulator. Then, specifically, the variable and mechanism element correspondence table 105 is as shown in FIG. 13.

In this example, at a step 504 in the flow chart in FIG. 3, changes in the values of x and y are calculated on the basis of the description of the dynamics model shown in FIG. 7. Then at a step 505, the table in FIG. 12, i.e. the variable and mechanism element correspondence table 105, is referenced. Data representing a set of the value of the variable x and the name Slide1 is transmitted to the kinematics simulation unit 103. Similarly, data representing a set of the value of the variable y and the name Joint1 is transmitted to the kinematics simulation unit 103. At a step 506, the three-dimensional positions of the individual parts such as those shown in FIG. 12 are calculated. On the bases of the three-dimensional positions, the distance 418 is also calculated. The value of the distance 418 sets a value for the sensor Switch1. At a step 507, the value for the sensor Switch1 and others are transmitted to the mechanism control system.

Second Embodiment

Now, a second embodiment of the present invention will be described. In the description of the first embodiment, the HCC, a well-known hybrid programming language, is used. However, in the second embodiment, description will be based on a DCML (Dynamics Constraint Modeling Language), a hybrid programming language developed by the inventor. The DCML solves an initial-value problem for a system expressed by simultaneous ordinary differential equations as in the case with other hybrid modeling languages such as the HCC. That is, a dynamics simulation can be achieved by providing initial values and executing a simulation indicating how the system varies over time. To describe a model, ordinary differential or algebraic equations can be expressed like declarations in a constraint format. However, unlike the HCC, the DCML does not allow the use of inequalities in order to, for example, maintain a high processing speed. The DCML allows a system expression model for a continuous system to be discontinuously switched using certain timings. Specifically, it is possible to use events to specify timings and then use these timings to remove, add, or change ordinary differential or algebraic equations expressed in a constraint format.

The DCML enables model parts (software parts) to be defined using classes on the basis of the concept of object oriented approach. First, the nature and behavior of each model part are described as class definitions. An instance of each model part is generated by a mechanism called a constructor. Once actuators and sensors are modeled as classes, theses classes can be utilized to compactly describe a model for a dynamics simulator based on the DCML. Moreover, since constraints can be described like declarations in no particular order, the whole model can be created simply by joining programs for the model parts together.

Using an example, a further description will be given below of how a DCML program is described. FIG. 14 shows a simple DCML program containing no discontinuous changes. The DCML has a syntax similar to that of C++. In this example of a program, "cont" denotes a declaration of a continuous variable or a function taking a continuous value. The equations "a=0;" and "b=0;" indicate the initial values of continuous variables at a time t=0. The control statement "always" indicates that the corresponding b'=0.2; and a'=sin (b); are active in the corresponding time interval. In this example, no events occur which cause a discontinuous change. Accordingly, the corresponding time interval is the entire time interval, and b'=0.2; and a'=sin(b); are active at all the points in time. The last statement "sample (a)" calls a special built-in function to record temporal changes in specified variable.

The DCML includes continuous variables and event variables. "cont" and "event" are used for the declarations of the respective variables. A continuous system is expressed using continuous system constraints expressed using continuous variables. The syntax of a expression of a continuous constraint is formally expressed as follows:

[Expression 1]
ContConst::=Term RelOp Term
    RelOp::=
        Term::=UVariableExpr|Term BinOp Term
UVariableExpr::=VariableExpr|Constant|+UVariableExpr|–UVariableExpr
VariableExpr::=
    Variable|VariableExpr.Variable|VariableExpr'|UnOp
    (VariableExpr)|
(Term)
    BinOp::=+|–|*|/|^
    UnOp::=sin|cos|tan|asin|acos|atan|sqrt|abs In this case, "Variable" denotes a variable name, and "Constant" denotes a real number. "Variable'" is a time differentiation of "Variable". A continuous system is modeled as simultaneous equations for active continuous system constraints. A control statement controls the activation and deactivation of a continuous system constraint. A continuous system constraint without a control statement is activated only at a time 0 to specify the initial value of the corresponding variable. The "always" statement must be used in order to keep a continuous system constraint active. For example, the "always" statement is used as follows:

[Expression 2]
always a'=1;
always {a'=1; b'=2;}

A discontinuous change in a continuous system corresponds to the activation and deactivation of a continuous system constraint. Such control is carried out by evaluating a conditional statement. The DCML provides two types of conditional statements.

A first type is in the format of "if (CondClaus1) A else B". The syntax is formally expressed as follows:

[Expression 3]
    CondClaus1::=CondTerm|CondTerm CondOp CondTerm
CondOp::=&&| ||
    CondTerm::=Term CondBinOp Term
CondBinOp::==|>|>=|<|<=

For example, the example below evaluates "a>1". On the basis of the result of the evaluation, the value of the variable b changes.

[Expression 4]
  if (a>1) b=0;
  else b=1;

According to a second type, a conditional statement must be composed of only one equation. The corresponding syntax is formally expressed as follows:

[Expression 5]
    CondClaus2::=Term =Term
    This type includes two control statements.

[Expression 6]
  when (CondClause2) {A}
  do {B} watching (CondClause2);
    The "when" statement shown above searches for the timing with which "CondClaus2" is established. The "when" statement then uses this timing to activate a continuous system constraint A. A "do-watching" statement first activates a continuous system constraint B. The "do-watching" statement then searches for the timing with which "CondClaus2" is established, to deactivate the continuous system constraint.

Figure 15:
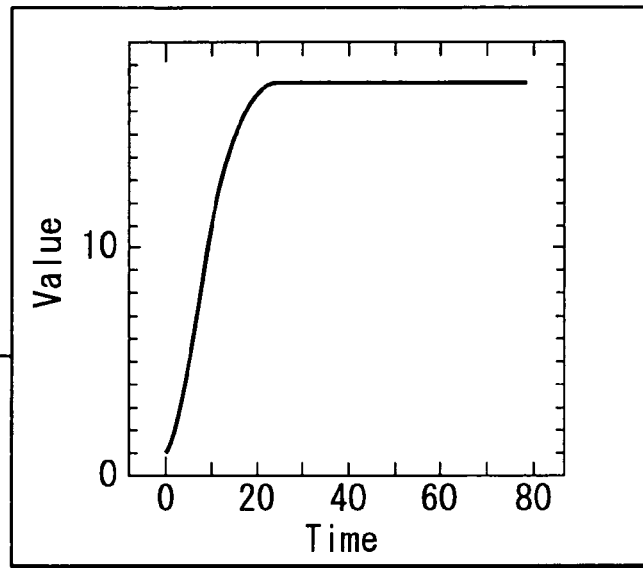
FIG. 15 is a diagram showing an example of a class definition according to the second embodiment of the present invention.

The DCML enables classes to be defined on the basis of the concept of object oriented approach. The class definition is based on a syntax similar to that of C++. FIG. 15 shows an example of a simple class definition. The scope (effective range) of a variable is defined using a private statement or a public statement for a variable declaration. The public variable can be externally accessed using a format similar to that in C++. For example, the public variable "m_a" in FIG. 15 can be externally referenced using the format "appl.m_a". The constructor "DCML_Class (cont a)" for classes has one argument "cont a" which is used to initialize the classes. A def statement specifies instances of the classes and is executed during a simulation. In this example, a state transition occurs when "m_a'=0" is established.

FIG. 16 shows an example of a paper conveying system model. For description, this model is significantly simplified compared to an actual model. Model parts such as a motor and paper are prepared in advance as shown in S1. To initialize the motor, an initial speed, attributes can be specified including an acceleration time, and a stop timing. Upon receiving a motor start command, the motor starts to operate at the specified initial speed and accelerates. Subsequently, the motor shifts to a fixed speed mode and is then stopped using the specified timing. The paper is assumed to be conveyed on a belt conveyor. The relationship between the rotation speed of the motor and the speed of the paper is described in the model. The program shown in S2 in the figure is to be added by a designer. The first line indicates that the "motor1" is attached to the conveying system for the "paper1" and that the speed of the motor is equal to the speed of the paper. The subsequent line contains the definitions of the motor and paper and a control scenario. In this example, the motor start command is generated at time=10 and time=70. In an actual simulation, the predefined part and the program to be added by the designer are joined together to form a simulation model for a dynamics simulation.

Figure 8:
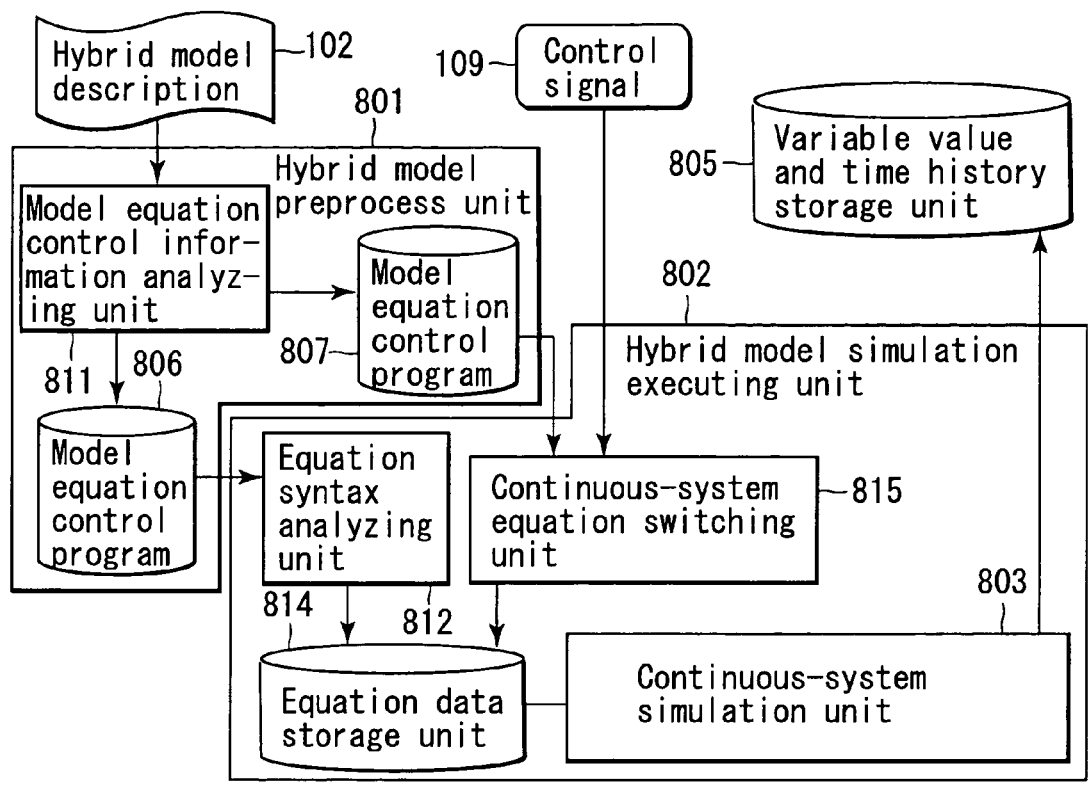
FIG. 8 is a block diagram showing an embodiment of a dynamics simulation unit according to the second embodiment of the present invention.

With reference to FIG. 8, a further description will be given of a dynamics simulation using a hybrid model description. FIG. 8 is a block diagram showing an embodiment of the dynamics simulation unit 101, shown in FIGS. 1 and 2.

The present embodiment includes a hybrid model preprocess unit 801 and a hybrid model simulation executing unit 802. The hybrid model description 102 is a source program described in the DCML language and is an input to the hybrid model preprocess unit 801. The control signal 109 is an input to the hybrid model simulation executing unit 802 and is provided by the mechanism control software system or its simulator. An output from the mechanical hybrid model simulation executing unit 802 according to the present embodiment is the results of calculation of variable values as the results of a simulation and their time history. These data are outputted to a variable value time history storage unit 805.

As shown in FIG. 8, the hybrid preprocess unit 801 comprises a model equation control information analyzing unit 811. The hybrid model simulation executing unit 802 comprises an equation syntax analyzing unit 812, an equation data storage unit 814, a continuous-system equation switching unit 815, and a continuous-system simulation unit 803. The present embodiment can be constructed using a common computer. The computer basically comprises hardware including a central processing unit (CPU), memory, an external storage device, a communication interface (I/F), a display device, and an input device such as a keyboard or a mouse, none of which are shown in the drawings. The computer also comprises an operating system (OS) for controlling the hardware. The mechanism simulator according to the embodiment of the present invention can be mounted as application software operating on such an operating system.

Now, description will be given of a process executed by the hybrid model preprocess unit 801. The hybrid model description 102 is first processed by the model equation control information analyzing unit 811 of the hybrid model preprocess unit 801. Thus, a model equation registration program 806 and a model equation control program 87 are generated. For the hybrid model simulation executing unit 102 as a software module, API (Application Program Interface) functions are provided including a function for registering model equations and a function for switching a continuous system equation. The model equation registration program 806 and the model equation control program 807 are each obtained by properly combining a description that calls the corresponding API function with the inputted hybrid model description 102. In view of this, the hybrid model preprocess unit 801 can be considered to be a kind of compiler which uses the hybrid model description 102 as an input, while using as an output, for example, a C program (source) containing descriptions of API function calls in the C language. The model equation registration program 806 and the model equation control program 807 are complied by a compiler such as the C language to generate a library than can be dynamically linked for execution. When a simulation is executed, the hybrid model simulation executing unit 802 gets ready for execution after a generated dynamic link has been linked and a simulation program has been completed which faithfully expresses an input hybrid model. During execution, an API function for activating the equation syntax analyzing unit 812 is called. Subsequently, a group of API functions for switching a continuous system equation are executed to achieve a continuous system simulation.

Various specifications are possible for a specific software module that realizes an application interface for the hybrid model simulation unit 802. For the convenience of description, it is assumed that at least the three API functions shown below are defined. The C language is used as a programming language.

[Expression 7]

int XXX_AddEqnData(char*eqn, int*err)
int XXX_AActivateEqn(int eqnid)
int XXX_DeActivateEqn(int eqnid)

The first API function XXX_AddEqnData specifies, as an argument, a pointer to a string indicative of one continuous system equation. The function XXX_AddEqnData executes a process of syntactically analyzing this continuous system equation, converting the description of the continuous equation system into a data structure (internal data expression) that can be simulated, and registering the internal data expression in the equation data storage unit 814. A unique ID number is assigned to the continuous system equation.

Figure 9:
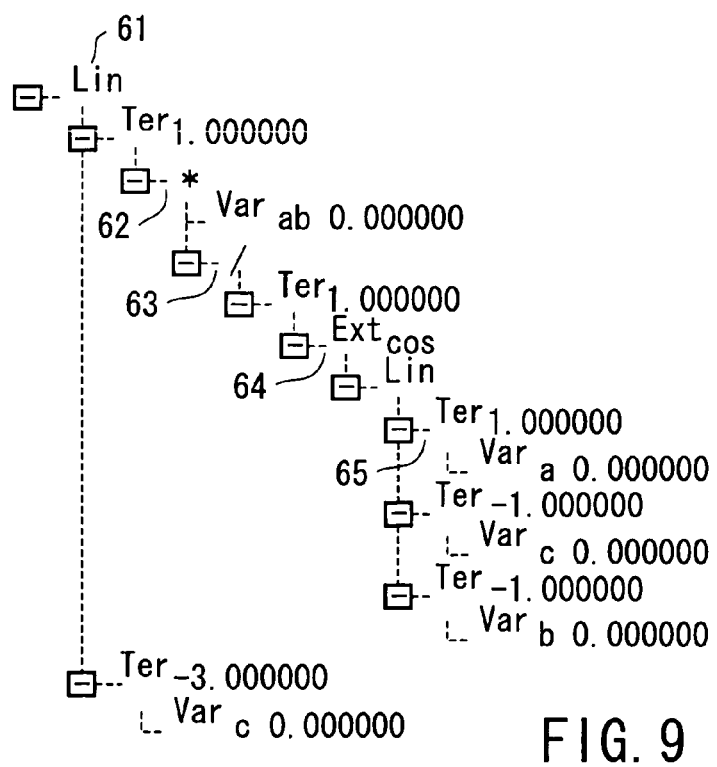
FIG. 9 is a diagram illustrating an internal data expression obtained by syntactically analyzing one continuous system equation according to the second embodiment of the present invention.

For example, given the expression "ab/cos(a−(c+b))−3c", a tree structure such as the one shown in FIG. 9 is generated as the internal data expression. In this tree structure, for example, reference numeral 61 denotes a master node for a linear polynomial. Reference numerals 62 and 63 denote nodes for a multiplication and a division, respectively. Reference numeral 64 denotes a node for an external function (different from addition, subtraction, multiplication, or division). Reference numeral 65 denotes a node for each item of the linear polynomial. In the present example, what correspond to leaves in the tree structure are all variables (a, b, and c). Real coefficients are added to these variables to form a linear equation. The linear equation may act as an argument for an external function or may be multiplied or divided by a certain number. Each variable is provided with a flag indicating whether or not a value has been determined. On the basis of data on the tree structure, the current value of each variable is held. Provided that the values for all the leaves of the tree structure have been determined, the value of the equation can be calculated. In the equation data storage unit 114, internal data structures are already joined together to form a tree structure in order to execute a calculation of the value of the equation.

In the above process, if any error occurs, an error code is set in err. If the process ends correctly, the ID number of the registered equation is provided as a return value.

The second API function XXX_ActivateEqn activates the equation corresponding to the ID number of an equation specified as an argument. If an already activated equation is specified, nothing occurs. The return value is an error code.

In contrast, the third API function XXX_DeactivateEqn deactivates the equation corresponding to the ID number of an equation specified as an argument. If an already deactivated equation is specified, nothing occurs.

The model equation control information analyzing unit 811 generates a function (InitEqnData) for sequentially calling equations requiring the XXX_AddEqnData. This corresponds to the model equation registration program 806.

The model equation control information analyzing unit 811 also generates a function (ChangeEqn) activated at intervals of a time Δt during the execution of a simulation to check conditions and change equations. This corresponds to the model equation control program 807. The above process executed by the hybrid model preprocess unit 801 automatically generates a source program in the C language such as the one shown below, for example, in connection with the hybrid model description shown in FIG. 7.

[Expression 8]

```
static char eqn1[] ="f=mx"";
static char eqn2[] ="f=mx"";
static int eqn1id;
static int eqn2id;
int InitEqnData( )
{
    int err;
    eqn1id = XXX_AddEqnData(eqn1,&err);
    if(err!=0)return err;
    eqn2id = XXX_AddEqnData(eqn2,&err);
    if(err!=0)return err;
    return0;
}
int ChangeEqn( )
{
    int err;
    BOOL GetEvent(char*eventname);
    If(GetEvent(Left)) {
        Err = XXX_ActivateEqn(eqn1id);
        if(err!=0)return err;
        XXX_DeActivateEqn(eqn2id);
        if(err!=0)return err;
    }
```

-continued

```
if(GetEvent(Right)) {
    XXX_ActivateEqn(eqn2id);
    if(err!=0)return err;
    XXX_DeActivateEqn(eqn1id);
    if(err!=0)return err;
}
```

Getevent is a function of checking whether or not an event specified by name has already occurred.

The above program is compiled by a C language compiler as described above and is formed into a dynamic link library format. The dynamic link library is linked during execution.

In the description of the present embodiment, the C language is used as a program language. However, the present invention is not limited to this aspect. For example, other program languages such as a CPP language and a Spec-C language may also be used.

Now, the execution of a simulation will be described. When a simulation is executed, the hybrid model simulation executing unit 802 is first activated. Then, the value of a continuous system equation is calculated while receiving the control signal 109 from the simulator 108 of the mechanism control software system, shown in FIG. 2. At this time, the continuous-system equation switching unit 815 switches the continuous system equation using activate/deactivate flags on the basis of the model equation control program 807, described above. In the state shown in FIG. 4, the equation of motion eq1 in FIG. 7 is deactivated, whereas the equation of motion eq2 in the same figure is activated. In the situation shown in FIG. 3 and in which a Left event has occurred, the flags are operated to so as to activate the equation of motion eq1 in FIG. 7, while deactivating the equation of motion eq2 in the same figure. These activate/deactivate flags are managed as attribute data on equations stored in the equation data storage unit 814.

The continuous-system simulation unit 803 references the equation data storage unit 814 to execute, in increments of time steps, a numerical integration on internal data on the continuous system equation stored in the storage unit 814 in a tree structure format. A simulation is an initial-value problem for nonlinear simultaneous equations including ordinary differential equations and algebraic polynomials. Thus, for example, the initial state shown in FIG. 4 is given. Specifically, the values of variables are calculated using the Runge-Kutta algorithm, which is commonly used.

The simulation is executed for a required time by outputting required data from the mechanism simulator, returning to the processing executed by continuous-system equation switching unit 815, and repeating the above process. The results of the simulation are saved to the variable value time history storage unit 805 and are utilized for analysis after the simulation.

Description has been given of the hybrid model language such as shown by the expressions 1 to 6 and the simulation model using the hybrid model language as shown in FIG. 16. It is assumed that the above language and model are utilized as the dynamics simulation unit 101 and that the dynamics simulation unit 101 is allowed to cooperate with the kinematics simulation unit 103. If the DCML model in FIG. 16 is used, "paper.val_", "motor1.val_" for example are specified as variable names for the correspondences illustrated in FIG. 13. It is relatively easy to specify these names because they are contained in the program to be added by the designer. On the other hand, for variables which must be associated with the mechanism elements in order to allow a three-dimensional mechanism model to operate but which appear only in a predefined dynamics model, it is difficult to achieve correspondences such as those shown in FIG. 13 when a model is created.

For example, it is assumed that both sides of the shaft of the motor are used for different purposes so that one side of the shaft is used for driving, while a cooling fan is coupled directly to the other side. In a model such as the one shown in FIG. 16, the rotation angle of the fan need not be considered in the program to be added by the designer. However, if during a simulation, the designer desires to check how the fan rotates, on a graphics screen, using a three-dimensional kinematics simulation, then the designer must specify, for a mechanism element indicative of the fan shaft, a fan shaft variable name that appears only in the class definition of the motor. However, if a complicated model is constructed by loading a large number of predefined classes, it is difficult to select elements for a kinematics simulation and variables for a dynamics simulation. In the present embodiment, the moment a model is loaded, the elements to be associated with the variables are enumerated and only the possible ones of them are presented to the user for selection.

Figure 17:
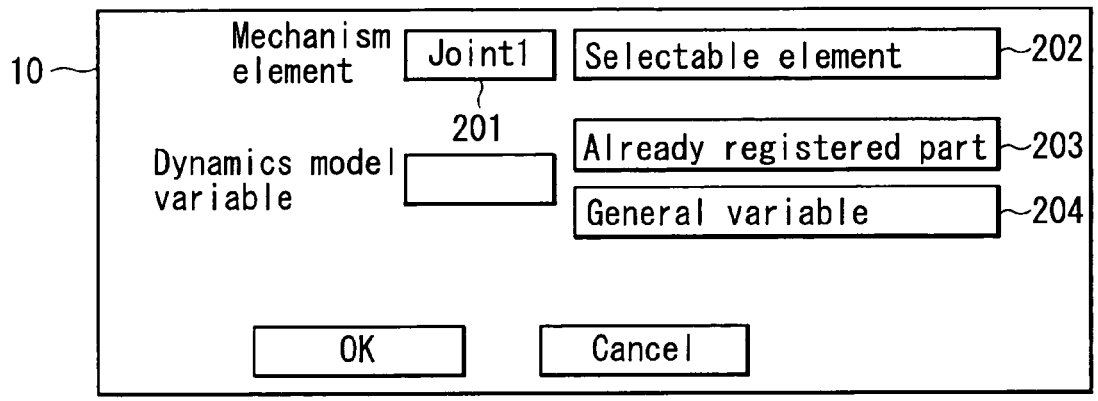
FIG. 17 is a diagram showing an input dialog according to the second embodiment of the present invention.

First, the mechanism elements of a three-dimensional mechanism model in a kinematics model are enumerated. In the example in FIG. 12, only the movements of "Slide1" and "Joint1" can be mechanism elements. Accordingly, they are displayed on the screen so that the user can select from them. FIG. 17 shows an example of a user input screen 10 (input dialog). Here, a mechanism element has already been inputted, with the name 201 of the selected mechanism element displayed. Depressing a selectable element button 202 enables selectable elements to be displayed.

On the other hand, for dynamics model variables, two buttons are provided: a button 203 used to select a variable from an already registered model and a button 204 used to select other variables. The button 203 used to select a variable from an already registered model is used to select a variable relating to a loaded class. The button 204 used to select other variables is used to select a variable that is not a member of the class. If the button 204 used to select other variables is depressed, a list of such variables is displayed in a popup menu. Then, the user selects a variable from the list.

Figure 18:
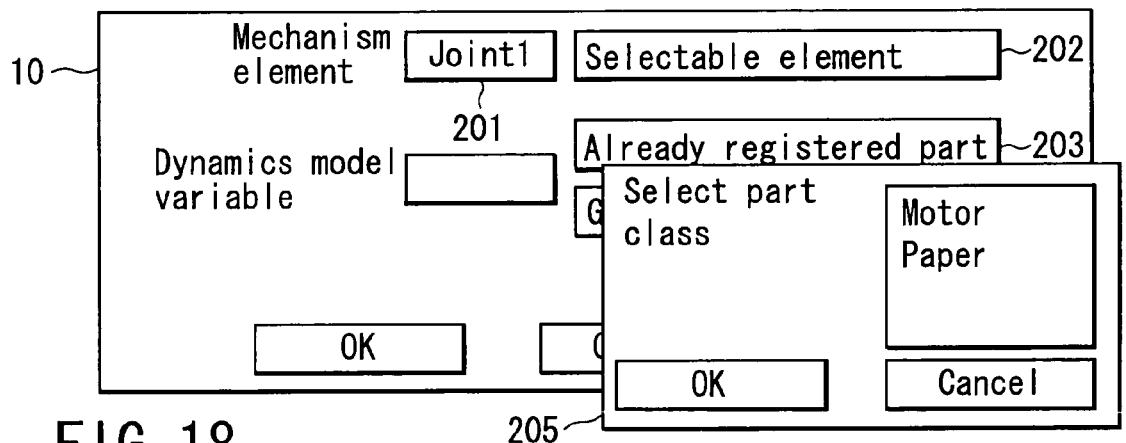
FIG. 18 is a view showing a class selection screen according to the second embodiment of the present invention.
Figure 19:
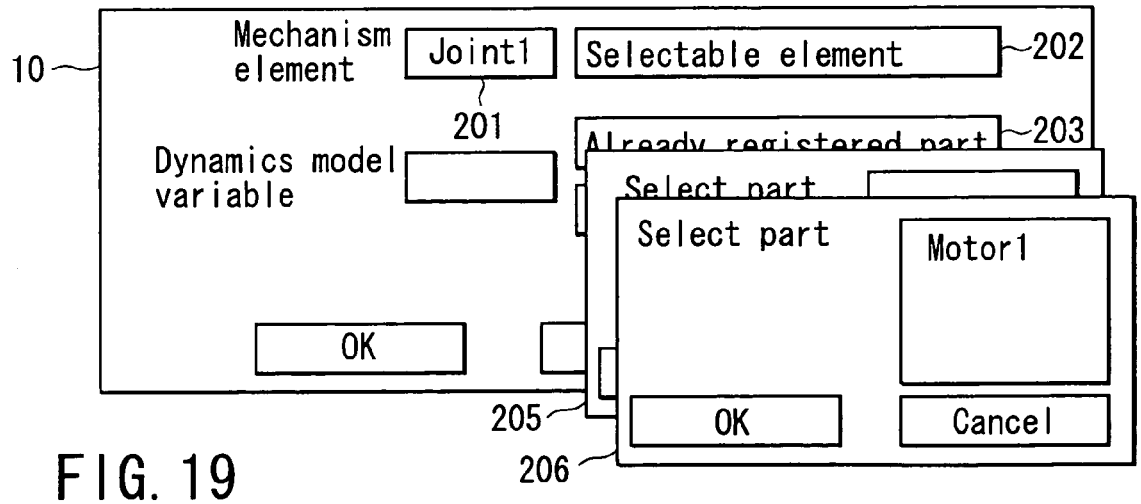
FIG. 19 is a view showing a part instance selection screen according to the second embodiment of the present invention.
Figure 20:
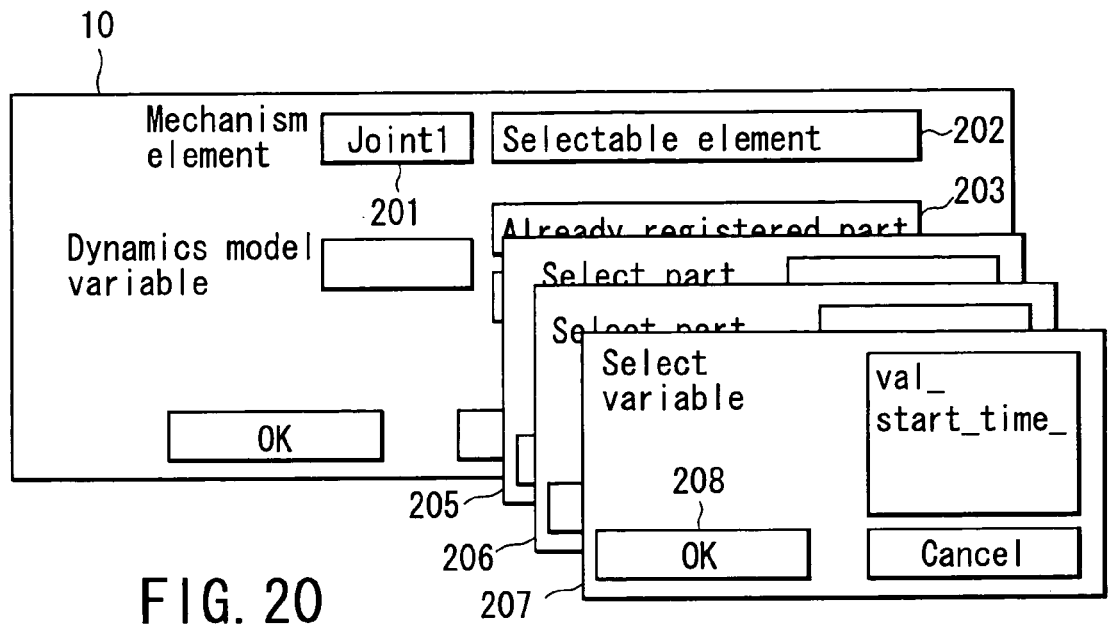
FIG. 20 is a diagram showing a continuous-variable list selection screen according to the second embodiment of the present invention.
Figure 21:
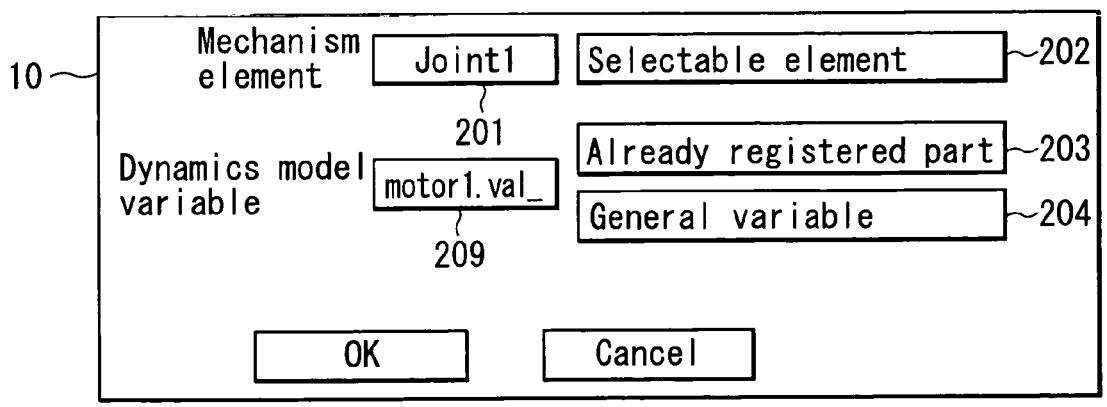
FIG. 21 is a diagram showing the results of specification of a continuous variable according to the second embodiment of the present invention.

If the button 203 used to select a variable from an already registered model is depressed, a list of classes is displayed. Then, the user selects a class from the list. FIG. 18 shows a relevant selection screen 20. Since the example of dynamics model in FIG. 16 includes two classes: Motor and Paper, these classes are both displayed. When the Motor class is selected, a popup menu 206 is displayed to allow the user to select an instance of the part as shown in FIG. 19. Here, only "motor1" is defined as an instance of the Motor class. When the user selects "motor 1", a list 207 containing only public continuous variables is displayed as shown in FIG. 20. Here, the user selects "val_" and then depresses an OK button 208. Then, "motor1.val_"(209) is specified as shown in FIG. 21.

If model parts of a hybrid model are defined utilizing the class function, a dynamics model created by the designer can be more easily described. However, it is complicated and cumbersome to search for variables when defining correspondences to a kinematics model. In this case, the second embodiment of the present invention allows the correspondences between the mechanism elements of the kinematics model and the variables of the dynamics model to be easily defined by hierarchically treating data in association with the structure of the hybrid model and correspondingly constructing a hierarchical menu.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer readable storage medium storing a computer program configured to cause a computer to execute a method for simulating a mechanism, said method comprising:

reading data representing a plurality of variables of a continuous system equation of a hybrid model described in a hybrid model programming language having a class definition functionality based on an object-oriented approach;

reading data of a three-dimensional mechanism model representing a geometric constraint relationship between a plurality of mechanism elements included in said mechanism;

extracting, from the data representing the variables, a plurality of selective variables each of which enables to be associated with any one of the mechanism elements wherein the mechanism elements include a rotation angle or displacement of an actuator;

extracting, from the data representing the mechanism elements, a plurality of selective mechanism elements each of which enables to be associated with any one of the variables;

receiving a selection which is made by a user and is indicative of a combination of one of the plurality of selective variables and one of the plurality of selective mechanism elements, to generate a table that represents a correspondence between the variables and the mechanism elements based on the selection, wherein the one of the plurality of selective variables in the combination is selected by selecting a class of predefined hybrid model to which the selective variables belong, and selecting a member variable in the class;

calculating a value of one of the variables of the continuous system equation by a first simulator that executes the hybrid simulation in which a behavior of the mechanism is simulated;

identifying a mechanism element corresponding to a variable having the calculated value, referring to the table;

transmitting, to a second simulator, information specifying the identified mechanism element and the calculated value of the variable; and executing a kinematic simulation by calculating a transformation matrix for each of said plurality of mechanism elements based on the data of the three-dimensional model.

2. The computer readable storage medium according to claim 1, said method further comprising:

inputting, from a state transition model, a control signal from an external mechanism control software system.

3. The computer readable storage medium according to claim 1, said method further comprising instructing the computer to store the generated table to a file.

4. A method of simulating a mechanism, comprising:

reading data representing a plurality of variables of a continuous system equation of a hybrid model described in a hybrid model programming language having a class definition functionality based on an object-oriented approach;

reading data of a three-dimensional mechanism model representing a geometric constraint relationship between a plurality of mechanism elements included in said mechanism;

extracting, from the data representing the variables, a plurality of selective variables each of which enables to be associated with any one of the mechanism elements wherein the mechanism elements include a rotation angle or displacement of an actuator;

extracting, from the data representing the mechanism elements, a plurality of selective mechanism elements each of which enables to be associated with any one of the variables;

receiving a selection which is made by a user and is indicative of a combination of one of the plurality of selective variables and one of the plurality of selective mechanism elements, to generate a table that represents a correspondence between the variables and the mechanism elements based on the selection, wherein the one of the plurality of selective variables in the combination is selected by selecting a class of predefined hybrid model to which the selective variables belong, and selecting a member variable in the class;

calculating a value of one of the variables of the continuous system equation by a first simulator that executes the hybrid simulation in which a behavior of the mechanism is simulated;

identifying a mechanism element corresponding to a variable having the calculated value, referring to the table;

transmitting, to a second simulator, information specifying the identified mechanism element and the calculated value of the variable; and executing a kinematic simulation by calculating a transformation matrix for each of said plurality of mechanism elements based on the data of the three-dimensional model.

5. The method according to claim 4, further comprising:

inputting, by a state transition model, a control signal from an external mechanism control software system.

6. The method according to claim 4, further comprising storing the generated table to a file.

* * * * *

UNITED STATES PATENT AND TRADEMARK OFFICE
CERTIFICATE OF CORRECTION

PATENT NO. : 7,398,190 B2  Page 1 of 1
APPLICATION NO. : 10/743090
DATED : July 8, 2008
INVENTOR(S) : Kondo et al.

It is certified that error appears in the above-identified patent and that said Letters Patent is hereby corrected as shown below:

On the title page, Item (75), the second inventor's first name is incorrect. Item (75) should read:

-- (75)  Inventors: Koichi Kondo, Kawasaki (JP);
            Mitsunobu Yoshida, Kawasaki (JP) --

Signed and Sealed this

Twenty-sixth Day of August, 2008

JON W. DUDAS
*Director of the United States Patent and Trademark Office*